United States Patent [19]

Broström et al.

[11] Patent Number: 4,879,586
[45] Date of Patent: Nov. 7, 1989

[54] SEMICONDUCTOR COMPONENT

[75] Inventors: Doris Broström; Lennart Ryman, both of Heilbronn, Fed. Rep. of Germany

[73] Assignee: Telefunken electronic GmbH, Heilbronn, Fed. Rep. of Germany

[21] Appl. No.: 927,492

[22] Filed: Nov. 5, 1986

[30] Foreign Application Priority Data

Nov. 29, 1985 [DE] Fed. Rep. of Germany ....... 3542166

[51] Int. Cl.⁴ .................... H01L 21/516; H01L 21/31
[52] U.S. Cl. ........................................ 357/54; 357/59; 357/71
[58] Field of Search ....................... 357/54, 59, 71, 67, 357/73, 63, 52

[56] References Cited

U.S. PATENT DOCUMENTS

| | | | |
|---|---|---|---|
| 4,063,275 | 12/1977 | Matsushita et al. | 357/54 |
| 4,084,986 | 4/1978 | Aoki et al. | 357/52 |
| 4,161,744 | 7/1979 | Blaske et al. | 357/54 |
| 4,420,765 | 12/1983 | Tarng | 357/54 |

FOREIGN PATENT DOCUMENTS

| | | |
|---|---|---|
| 2361171 | 6/1974 | Fed. Rep. of Germany . |
| 2700463 | 7/1978 | Fed. Rep. of Germany . |
| 3224248 | 1/1983 | Fed. Rep. of Germany . |
| 3100979 | 4/1985 | Fed. Rep. of Germany . |

OTHER PUBLICATIONS

Matsushita et al "Highly Reliable High-Voltage Transistor by Use of SIPOS Process", *IEEE Transactions on Elect. Devices* vol. ED-23, No. 8, Aug. 1976, pp. 826–830.

Primary Examiner—Rolf Hille
Assistant Examiner—S. V. Clark
Attorney, Agent, or Firm—Spencer & Frank

[57] ABSTRACT

In a semiconductor component, in particular, a high-voltage transistor, with an oxygen doped or nitrogen doped silicon layer on the surface, a glass layer is provided between the doped silicon layer and the semiconductor surface.

10 Claims, 1 Drawing Sheet

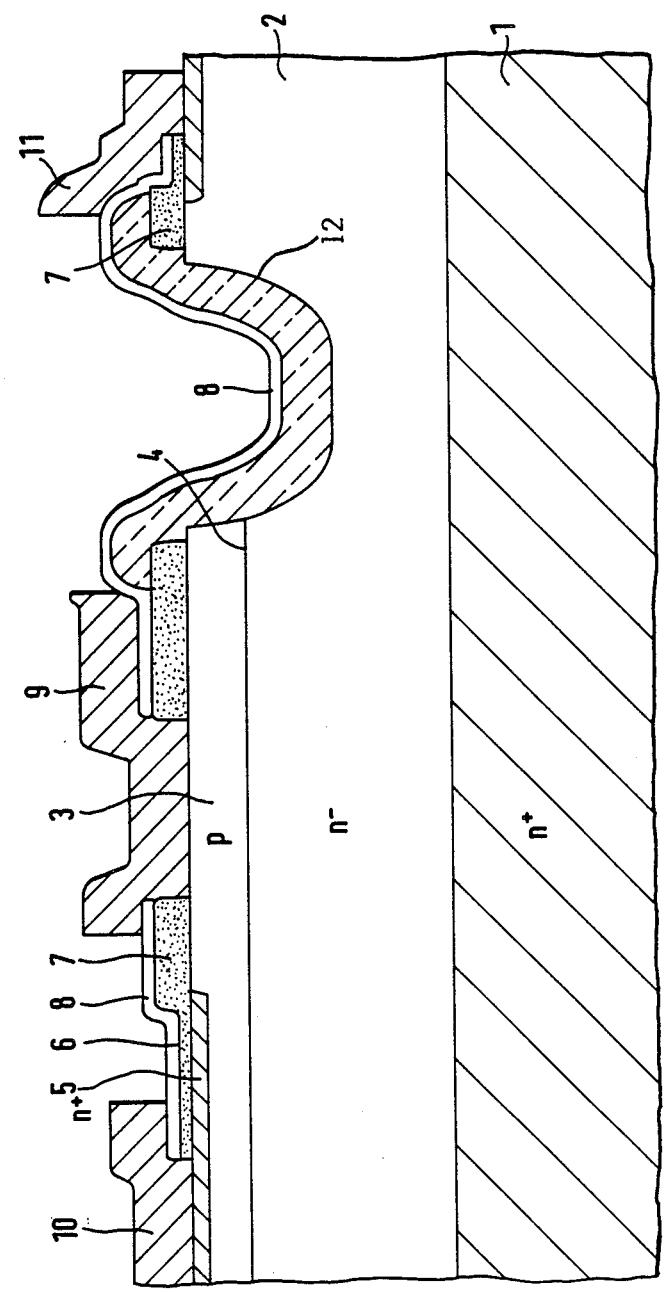

SEMICONDUCTOR COMPONENT

BACKGROUND OF THE INVENTION

The present invention relates to a high voltage transistor.

It is known from an article by T. Matsushita, et al, "Highly Reliable High-Voltage Transistors by Use of the SIPOS Process" the "IEEE Transactions on Electron Devices", Volume Ed-23, No. 8, August 1976, pages 826–830, to apply to the semiconductor surface of a high-voltage transistor a so-called SIPOS (semi-insulating polycrystalline silicon) layer consisting of polycrystalline silicon which is doped with oxygen or with nitrogen.

Glass passivated high-voltage transistors without SIPOS covering have the disadvantage that in the event of thermal and/or electrical load, $U_{(BR)CBO}$, $I_{CES}$ and $I_B$ drifts may occur.

SUMMARY OF THE INVENTION

The object of the invention is to provide a semiconductor component, in particular, a high-voltage transistor, wherein this disadvantage does not occur, and wherein reverse voltage and $I_B$ drifts are at least minimized.

The above object is basically achieved in that in a semiconductor component with an oxygen doped or nitrogen doped silicon layer on its surface, a glass layer is provided, in accordance with the invention, between the doped silicon layer and the semiconductor surface. The silicon layer is preferably polycrystalline and the glass layer preferably consists of a lead-boron-aluminosilicate glass. Moreover, in a high voltage semiconductor transistor, the doped silicon layer is connected at one of its ends to the bsse electrode and at its other end to the collector electrode.

BRIEF DESCRIPTION OF THE DRAWING

The invention will now be below in greater detail, by way of examples, with reference to the drawing, in which the Figure shows a high-voltage transistor.

DETAILED DESCRIPTION OF THE PREFERRED EMBODIMENT

The high-voltage transistor illustrated in the FIGURE has a collector zone comprised of a low-resistance substrate 1 of the first conduction type and a higher-resistance semiconductor layer 2 of the same conduction type. In the embodiment, the semiconductor substrate 1 and the higher-resistance epitaxial or zone-pulled, single-crystal layer 2 have, for example, the n-conduction type. Arranged above the higher-resistance semiconductor layer 2 is the base zone 3 which is produced, for example, by diffusion into the epitaxial layer 2 or by epitaxy. The conduction type of the base zone is the opposite of the conduction type of the collector zone. In the embodiment, the base zone 3 has the p-conduction type. The pn-junction 4 formed by the semiconductor zone 2 and the base zone 3 extends over the entire cross-section of the semiconductor member and thus to the lateral surface of the semiconductor member.

The emitter zone 5 is located in the base zone 3. The emitter zone 5 is produced, for example, by prediffusion and/or ion implantation with subsequent diffusion. A diffusion mask is used in the production of the emitter zone by diffusion. To produce the diffusion mask, the $SiO_2$ i.e., quartz-glass, layer 6 is produced on the semiconductor surface, and this layer is provided with an emitter diffusion window through which the emitter zone 5 is diffused into the base zone 3. The $SiO_2$ layer is produced, for example, by thermal oxidation.

During or after the emitter diffusion, the semiconductor surface is oxidized again, in the course of which the emitter diffusion window is closed and the existing $SiO_2$ layer is reinforced. During this oxidation, the $SiO_2$ or quartz-glass layer 7 is produced. A polycrystalline silicon layer 8 which is doped with oxygen or with nitrogen is applied to the $SiO_2$ layer 7. The doped polycrystalline silicon layer 8 is produced, for example, by deposition in an oven of 600°–650° C. by supplying laughing gas ($N_2O$) and silane. The polycrystalline silicon layer 8 has the advantage that it makes the glass-silicon-boundary located thereunder more stabile and protects it against environmental influences.

After layers 7 and 8 have been produced, contacting holes are made in these two layers and the thereby exposed semiconductor zones are provided with electrodes. This results in base electrode 9 and emitter electrode 10. The collector zone is contacted on the semiconductor member side located opposite to the emitter zone.

As can be seen from the FIGURE, a portion of the upper surface of the semiconductor body or member adjacent the base zone 2 is recessed and the edge of the collector-base pnjunction 4 extends to the upper surface within the recess. This recess is covered with a passivation glass layer 12 which in turn is covered with the oxygen or nitrogen doped polycrystalline silicon layer 8. Preferably, as shown, the glass layer 12 is not a quartz-glass layer, but rather consists of a commercially available passivation glass, preferably a lead-boron-alumosilicate glass.

As is apparent from the FIGURE, the doped silicon layer 8 is electrically connected to both the base electrode 9 and the collector electrode 11. If the doped silicon layer 8 is of weak conductivity, the potential difference between the base electrode and the collector electrode prevents ionic charging of the surface and, consequently, unstable behavior of the collector base diode and also the emitter base diode of the transistor. The SIPOS layer 8 of weak conductivity also prevents charge accumulations in the isolating layer if the layer 8 is connected via electrodes to the collector and the base of the transistor.

What is claimed is:

1. In a high-voltage transistor including a semiconductor body having emitter, base and collector zones, respective electrodes for said emitter, base and collector zones disposed on a surface of said semiconductor body, an oxygen or nitrogen doped silicon layer disposed on at least the portions of the surface of said semiconductor body between said electrodes, and a glass layer provided between said doped silicon layer and said surface of said semiconductor body, the improvement wherein the portion of said doped silicon layer disposed between said base and collector electrodes is connected at one of its ends to said base electrode and is connected at its other end to said collector electrode.

2. A transistor as defined in claim 1, wherein said doped silicon layer is polycrystalline.

3. A transistor as defined in claim 1, wherein the glass layer disposed on said portion of said surface of said semi-conductor body between said base and collector electrodes consists of a commercially available passivation glass.

4. A transistor as defined in claim 1, wherein the doped silicon layer is connected to different potentials.

5. A transistor as defined in claim 1 wherein the base-collector pn-junction of said transistor extends to said portion of said surface between said base and collector electrodes.

6. A transistor as defined in claim 1 wherein a portion of said glass layer is formed of quartz-glass.

7. In a high voltage transistor including a semiconductor body having emitter zone, a base zone and a collector zone, and with the emitter-base and base-collector pn-junctions extending to the surface of said semiconductor body, a glass passivation layer covering said surface of said semiconductor body except for respective openings for respective electrodes for contacting said emitter, base and collector zones, a polycrystalline silicon layer doped with oxygen or nitrogen covering said passivation layer, and respective emitter, base and collector electrodes disposed in said openings; the improvement wherein said polycrystalline silicon layer is of weak conductivity and is connected to said base electrode and to said collector electrode.

8. A trnsistor as defined in claim 7 wherein the portion of said glass passivation layer disposed on said surface of said semiconductor body between said base and collector electrodes comprises a commercially available passivation glass.

9. A transistor as defined in claim 8 wherein said commercially available passivation glass is a lead-boron-alumosilicate glass.

10. A transistor as defined in claim 7 wherein at least a portion of said glass passivation layer is formed of quartz-glass.

* * * * *